United States Patent
Shimatani

(10) Patent No.: US 7,170,351 B2
(45) Date of Patent: Jan. 30, 2007

(54) DIFFERENTIAL AB CLASS AMPLIFIER CIRCUIT AND DRIVE CIRCUIT USING THE SAME

(75) Inventor: Atsushi Shimatani, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/948,438

(22) Filed: Sep. 24, 2004

(65) Prior Publication Data
US 2005/0068105 A1    Mar. 31, 2005

(30) Foreign Application Priority Data
Sep. 26, 2003  (JP) .............................. 2003-335559

(51) Int. Cl.
*H03F 3/45*    (2006.01)
*H03F 3/26*    (2006.01)

(52) U.S. Cl. ........................................ 330/255; 330/261
(58) Field of Classification Search ................ 330/255, 330/264
See application file for complete search history.

(56) References Cited
U.S. PATENT DOCUMENTS
5,311,145 A    5/1994  Huijsing et al.

6,005,440 A * 12/1999 Okamoto ..................... 330/253
6,121,839 A *  9/2000 Giacomini ................... 330/264
6,657,495 B2* 12/2003 Ivanov et al. ............... 330/255

FOREIGN PATENT DOCUMENTS
| JP | S61-35004 B2 | 8/1986 |
| JP | H07-142940 A | 6/1995 |
| JP | H09-232883 A | 9/1997 |
| JP | 2001-177352 A | 6/2001 |

* cited by examiner

*Primary Examiner*—Robert Pascal
*Assistant Examiner*—Alan Wong
(74) *Attorney, Agent, or Firm*—Sughrue Mion, PLLC

(57) ABSTRACT

A drive circuit includes a plurality of differential AB class amplifier circuits and a common bias circuit. Each amplifier circuit is configured as a voltage follower to input an analog signal and drive a data line based on the input analog signal. The common bias circuit generates a first bias signal set and a second bias signal set. Each amplifier circuit includes an N-channel differential amplifier circuit, a P-channel differential amplifier circuit that operates independently from the N-channel differential amplifier circuit, and an output stage circuit. The N-channel and P-channel differential amplifier circuits input a differential signal and output first and second output signals onto first and second output lines, respectively, based on the first bias signal set. The output stage circuit generates drive signal from the first and second output signals based on the second bias signal set and outputs the drive signal onto an output terminal.

19 Claims, 9 Drawing Sheets

Fig. 7

|  | USUAL MODE | TEST MODE |
|---|---|---|
| SWITCH 22 | ON | OFF |
| SWITCH 25 | OFF | ON |
| SWITCH 26 | OFF | ON |
| SWITCH 29 | OFF | ON |
| SWITCH 30 | OFF | ON |
| SWITCH 33 | ON | OFF |
| SWITCH 34 | ON | OFF |
| SWITCH 35 | OFF | ON |
| SWITCH 36 | OFF | ON |
| SWITCH 41 | OFF | ON |
| SWITCH 42 | OFF | ON |

DIFFERENTIAL AB CLASS AMPLIFIER CIRCUIT AND DRIVE CIRCUIT USING THE SAME

BACKGROUND OF THE INVENTION

1. Field of the Invention

The present invention relates to a drive circuit and a processing circuit, and more particularly, to a drive circuit composed of a plurality of differential AB class amplifier circuits, and a processing circuit using the drive circuit.

2. Description of the Related Art

Conventionally, a drive circuit or a processing circuit of this type is composed of a plurality of differential AB class amplifier circuits to drive a plurality of analog data lines in parallel or to amplify a plurality of analog signals in parallel in low power consumption.

A conventional drive circuit for a display unit voltage-drives capacitive load such as data lines of an LCD panel in parallel to output analog signals corresponding to display data. For this purpose, a plurality of differential AB class amplifiers with so-called Rail-To-Rail input/output function in an entire range of power supply voltage between a power supply line and a ground line are used in voltage follower connection.

For example, FIG. 1 is a block diagram showing the circuit structures of a display panel and the conventional drive circuit for the display unit. Referring to FIG. 1, the conventional drive circuit for the display unit drives a display panel 8, and is composed of a control circuit 4, a gradation power source 5, a scan line drive circuit 6 and a data line drive circuit 7.

The display panel 8 is a color liquid crystal panel of an active matrix drive type, uses thin film MOS transistors (TFT) as switching elements. A pixel is arranged in the point of each of intersections of the scan lines in a row direction and the data lines in a column direction in predetermined intervals. In each pixel, a liquid crystal capacity as a capacitive load and a TFT with a gate connected with the scan line are connected in series between the data line and a common electrode line.

A scan pulse is generated by the scan line drive circuit 7 based on a horizontal sync signal and a vertical sync signal and is applied to the scan line of each row of the display panel 8. An analog data signal is generated for every color by the data line drive circuit 7 based on digital display data and is applied to the data line of each column of the display panel 8 in a state in which a common potential Vcom is applied to a common electrode line. Thus, letters and an image are displayed on the display panel 8 in full colors.

Next, the data line drive circuit 7 will be described. This data line drive circuit 7 is composed of a D/A conversion circuit 71 and an output circuit 72. The D/A conversion circuit 71 D/A-converts the display data of each column by selecting one of the gradation voltages. An output circuit 72 carries out impedance conversion, drives the data line of each column and outputs the analog display data signal. The output circuit 72 is composed of a plurality of differential AB class amplifier circuits 1, in which Rail-To-Rail input/output is possible and which are in voltage follower connection, and a common bias circuit 2 which supplies a common bias voltage to the plurality of differential AB class amplifier circuits 1. The output circuit 72 of the conventional data line drive circuit 7 uses the differential AB class amplifier circuits 1 with less power consumption are used, and the plurality of data lines can be driven in parallel while the increase of circuit scale is restrained due to the plurality of arrays of the differential AB class amplifier circuits 1, through a combination of the common bias circuit 2 and them. Thus, a circuit area is reduced and the low power consumption is realized.

FIG. 2 is a diagram showing a first conventional example of the differential AB class amplifier circuit 1, which is disclosed in Japanese Laid Open Patent Application (JP-A-Showa 61-35004). This differential AB class amplifier circuit 1 is composed of a differential amplifier 17 and an AB class output circuit 18. As a driver of the AB class output circuit, a general differential amplifier 17 in which the Rail-To-Rail input/output is possible is used. The differential amplifier 17 is composed of an N-channel differential amplifier mirror output section 171 and a P-channel differential amplifier section 172.

The differential amplifier mirror output section 171 is composed of a pair of N-channel differential MOS transistors 112 and 113, a pair of P-channel load MOS transistors 114 and 115, a pair of P-channel mirror output MOS transistors 117 and 118, and a constant current source 116. The gates of the N-channel differential MOS transistors 112 and 113 are connected with a non-inversion input terminal Vin(+) and an inversion input terminal Vin(−). The P-channel load MOS transistors 114 and 115 are connected as loads of the N-channel differential MOS transistors 112 and 113. The P-channel mirror output MOS transistors 117 and 118 output mirror currents I4 and I5 of the differential currents of the P-channel load MOS transistors 114 and 115 to the N-channel load MOS transistors 124 and 125 of the differential amplifier section 172. The constant current source 116 supplies constant current I1 to sources of the N-channel differential MOS transistors 112 and 113.

Also, the differential amplifier section 172 is composed of a pair of P-channel differential MOS transistors 122 and 123, a pair of N-channel load MOS transistors 124 and 125, a constant current source 126. The gates of the P-channel differential MOS transistors 122 and 123 are connected with the inversion input terminal Vin(−) and the non-inversion input terminal Vin(+). The N-channel load MOS transistors 124 and 125 are connected as a current mirror-type load of the P-channel differential MOS transistors 122 and 123. The constant current source 126 supplies constant current I2 to sources of the P-channel differential MOS transistors 122 and 123. A signal is outputted from the drain of the P-channel differential MOS transistor 123 to the gate of the N-channel output stage MOS transistor 132 of the AB class output circuit 18.

The AB class output circuit 18 is composed of a pair of N-channel and P-channel output stage MOS transistors 131 and 132, a pair of constant current sources 137 and 138, a pair of N-channel and P-channel shift MOS transistors 135 and 136, and a pair of constant voltage sources 139 and 140. The P-channel and N-channel output stage MOS transistors 131 and 132 are respectively connected between the output terminal and the power supply terminal and between the output terminal and the ground terminal. The constant current sources 137 and 138 are respectively connected between the gate of the P-channel output stage MOS transistors 131 and the power supply terminal and between the gate of the N-channel output stage MOS transistors 132 and the ground terminal. The P-channel and N-channel shift MOS transistors 135 and 136 function as a level shifter and are connected in parallel between the constant current sources 137 and 138. The constant voltage sources 139 and 140 supply voltages which are lower than the power supply terminal and the ground terminal by the threshold voltages of two of diode-connection P-channel and N-channel MOS transistors connected in series.

It should be noted that when the bias sections of the plurality of differential AB class amplifier circuits 1 of this conventional example should be made common, the constant current sources 116, 126, 137 and 138 of the differential AB class amplifier circuits are constituted as current mirror circuit structures. The constant current MOS transistor for the mirror output and a mirror input MOS transistor are separated. The common bias circuit 2 is composed of a mirror input MOS transistor and constant voltage sources 139 and 140. The mirror input MOS transistor supplies the bias voltage to the gate of the constant current MOS transistor of the differential AB class amplifier circuit 1.

In this conventional differential AB class amplifier circuit, two constant current sources 116 and 126 of the differential amplifier 17 are generally constituted by current mirror circuits of the N-channel and P-channel MOS transistors, respectively. The input voltage range in which the P-channel MOS transistor of the constant current source 126 can operate normally is equal to or larger than VSS, and equal to or smaller than VDD−[Vgs+Vds(sat)]. In the input voltage range larger than VDD−[Vgs+Vds(sat)], the current mirror circuit of the N-channel MOS transistor of the constant current source 116 operates normally. By the two sets of P-channel MOS transistors 114 and 117, and 115 and 118 of the current mirror circuits, the mirror currents I4 and I5 of the differential currents based on bias current I1 are folded and are supplied to N-channel load MOS transistor 124 and 125. Therefore, a differential amplifier section operates in the input voltage range from the ground terminal to the power supply terminal, and the Rail-to-rail input becomes possible. Thus, the Rail-to-rail input/output function of the differential AB class amplifier circuit is achieved.

FIG. 3 is a circuit diagram showing a second conventional example of the above-mentioned differential AB class amplifier circuit, which is disclosed in Japanese Laid Open Patent Application (JP-P2001-177352A). This conventional differential AB class amplifier circuit 1 is composed of an N-channel differential amplifier 11, a P-channel differential amplifier 12 and an AB class output circuit 13, and the Rail-To-Rail input/output function is achieved.

The differential amplifier 11 is composed of a pair of N-channel differential MOS transistors 112 and 113, a pair of P-channel load MOS transistors 114 and 115 of a current mirror type, and an N-channel constant current source MOS transistor 111. The gates of the N-channel differential MOS transistors 112 and 113 are connected with an inversion input terminal Vin(−) and a non-inversion input terminal Vin(+). The P-channel load MOS transistors 114 and 115 are connected with the N-channel differential MOS transistors 112 and 113, respectively. The N-channel constant current source MOS transistor 111 inputs bias voltage BN to its gate and supplies a source constant current I1 to the N-channel differential MOS transistors 112 and 113. The output is connected from the drain of the N-channel differential MOS transistor 113 to the gate of the P-channel output stage MOS transistor 131 of the AB class output circuit.

The differential amplifier 12 is composed of a pair of P-channel differential MOS transistors 122 and 123, a pair of N-channel load MOS transistors 124 and 125 of a current mirror type, and a P-channel constant current source MOS transistor 121. The gates of the P-channel differential MOS transistors 122 and 123 are connected with the inversion input terminal Vin(−) and the non-inversion input terminal Vin(+). The N-channel load MOS transistors 124 and 125 are connected with the P-channel differential MOS transistors 122 and 123, respectively. The P-channel constant current source MOS transistor 121 inputs the bias voltage BP to its gate and supplies a source constant current I2 to the P-channel differential MOS transistors 122 and 123. The output is connected from the drain of the P-channel differential MOS transistor 123 to the gate of the N-channel output stage MOS transistor 132 of the AB class output circuit.

The AB class output circuit 13 is composed of a pair of P-channel and N-channel output stage MOS transistors 131 and 132, a pair of P-channel and N-channel constant current MOS transistors 133 and 134, and a pair of P-channel and N-channel shift MOS transistors 135 and 136. The P-channel and N-channel output stage MOS transistors 131 and 132 are connected between the output terminal and the power supply terminal and between the output terminal and the ground terminal. The gates of the MOS transistors 131 and 132 are connected with the output lines of the differential amplifiers 11 and 12, respectively. The P-channel and N-channel constant current MOS transistors 133 and 134 are connected between the output line of the differential amplifier 11 and the power supply terminal and between the output line of the differential amplifier 12 and the ground terminal, respectively. The gates of the MOS transistors 133 and 134 are connected with the P-channel and N-channel constant current bias voltages BP and BN. The P-channel and N-channel shift MOS transistors 135 and 136 are connected between the output lines of the differential amplifiers 11 and 12 in parallel to function as level shifters. Also, the AB class output circuit 13 is composed of a pair of P-channel and N-channel mirror output MOS transistors 141 and 142, and a pair of P-channel and N-channel mirror output MOS transistors 143 and 144. The P-channel and N-channel mirror output MOS transistors 141 and 142 are connected between the gate of the N-channel shift MOS transistor 136 and the power supply terminal and between the gate of the P-channel shift MOS transistor 135 and the ground terminal. The gates of the MOS transistors 141 and 142 are connected with the bias voltages BP and BN, respectively. The P-channel and N-channel mirror output MOS transistors 143 and 144 are connected between the gate of the P-channel shift MOS transistor 135 and the power supply terminal and between the gate of the N-channel shift MOS transistor 136 and the ground terminal. The P-channel and N-channel mirror output MOS transistors 143 and 144 pass P-channel and N-channel mirror currents I7 and I6 to the output stage MOS transistors 131 and 132. Moreover, in the AB class output circuit of this conventional example, a pair of mirror capacities 145 and 146 for phase compensation are connected between the respective gates of the P-channel and N-channel output stage MOS transistors 131 and 132 and the output terminal Vout. The differential AB class amplifier circuit has a good frequency response. It should be noted that the common bias circuit 2 is composed of P-channel and N-channel mirror input MOS transistors in the current mirror circuit to supply the bias voltages BP and BN to the plurality of differential AB class amplifier circuits of this conventional example.

In this conventional differential AB class amplifier circuit 1, the bias voltages BN and BP are applied to the gates of the N-channel and P-channel mirror output MOS transistors 142 and 141 for current mirror control. Also, the P-channel and N-channel mirror output MOS transistors 143 and 144 are controlled as a current mirror, similar to the P-channel and N-channel output stage MOS transistors 131 and 132. The nodes between the MOS transistors 143 and 142 and 141 and 144 are connected with the gates of the P-channel and N-channel shift MOS transistors 135 and 136. Therefore, the gate voltages of the P-channel and N-channel shift MOS transistors 135 and 136 are not constant, unlike the first conventional example. The gate voltages thereof dynamically change in accordance with the output state of the differential AB class amplifier circuit 1 to set only one of the P-channel and N-channel output stage MOS transistors 131 and 132 to a current mirror operating state. Thus, an idling current is suppressed to a small value so that crossover distortion is reduced.

Also, in the plurality of differential AB class amplifier circuits and the common bias circuit shown in FIGS. 2 and 3, the MOS transistors of the constant current source or the constant current MOS transistors and the shift MOS transistors are controlled to be turned off in a test mode, although being not shown. Also, the P-channel and N-channel test MOS transistors are connected between the power supply terminal and the gate of the P-channel output stage MOS transistor of the AB class output circuit 13 and between the ground terminal and the gate of the N-channel output stage MOS transistor such that they are turned on in the test mode. In the test mode, the pair of P-channel and N-channel output stage MOS transistors are turned off to set the idling current to zero. Thus, in the test mode, all the circuit current paths are turned off so that a chip leak current of the data line drive circuit can be measured.

However, there are some problems in the differential AB class amplifier circuit of the conventional drive circuits.

In the differential AB class amplifier circuit of the first conventional example shown in FIG. 2, although the Rail-to-rail input/output is possible, it is necessary to fold the mirror currents I4 and I5 of the differential current based on the bias current I1 in the input voltage range of VDD−[Vgs+Vds(sat)]. For this reason, the number of elements increases for the folding mirror circuit and the consumption current increases by the mirror current I4 and I5. This hinders high integration and realization of low power consumption.

In the differential AB class amplifier circuit of the second conventional example shown in FIG. 3, when the plurality of differential AB class amplifier circuits are used as the output circuits of the data line drive circuit, the gate voltages of the P-channel and N-channel shift MOS transistors 135 and 136 change in accordance with the output state of the differential AB class amplifier circuit 1. Therefore, the gates of the P-channel and N-channel MOS transistors 135 and 136 of the plurality of differential AB class amplifier circuits 1 cannot be connected in common. For this reason, four mirror output MOS transistors 141 to 144 are needed for every differential AB class amplifier circuit. This hinders high integration.

Also, the idling currents of the output stage MOS transistors of the differential AB class amplifier circuit are controlled by the current mirror. Therefore, the consumption current increases by the current mirror currents 16 and 17 of the four mirror output MOS transistors 141 to 144 shown in FIG. 3.

Also, when these differential AB class amplifier circuits 1 are used as the output circuits 72 of the data line drive circuit 7, the P-channel and N-channel test MOS transistors are added between the gate of the P-channel output stage MOS transistor and the power supply terminal and between the gate of the P-channel output stage MOS transistor and the ground terminal, in order to turn off all the circuit current paths in the test mode. Also, the gate voltages of the P-channel and N-channel output stage MOS transistors are fixed to the bias voltages. In the drive circuit of the display unit, 300 to 500 differential AB class amplifier circuits 1 are used per chip, so that 600 to 1000 P-channel or N-channel test MOS transistors are required. This hinders high integration.

In conjunction with the above description, an MOSFET power amplifier is disclosed in Japanese Laid Open Patent Application (JP-A-Heisei 7-142940). In this conventional example, a power output stage of the MOSFET power amplifier of a push-pull type has a CMOS structure. An offset stage is provided in front of the power output stage, and an amplifier stage provided in front of the offset stage to amplify an input signal. A gate bias voltage of a MOSFET of the power output stage is set by the offset stage.

Also, an operational amplifier circuit is disclosed in Japanese Laid Open Patent Application (JP-A-Heisei 9-232883). In this conventional example, the operational amplifier circuit is provided with first and second differential amplifier circuits with a set of first input terminal and a second input terminal, first and second level shift circuits, first and second current sources, a first and second output circuit composed of transistors. The first input terminal of the first differential amplifier circuit and the first input terminal of the second differential amplifier circuit are connected, and the second input terminal of the first differential amplifier circuit and the second input terminal of the second differential amplifier circuit are connected. The output of the first differential amplifier circuit is connected with the input of the said first level shift circuit. The output of the said first level shift circuit is connected with the first current source and the gate of a first transistor of the output circuit. The output of the second differential amplifier circuit is connected with the input of the second level shift circuit, and the output of the second level shift circuit is connected with the current source and the gate of a second transistor of the second output circuit.

SUMMARY OF THE INVENTION

Therefore, an object of the present invention is to achieve the high integration and low power consumption in a drive circuit containing a plurality of differential AB class amplifier circuits and a processing circuit using the drive circuit.

In an aspect of the present invention, a drive circuit includes a plurality of differential AB class amplifier circuits and a common bias circuit. The plurality of differential AB class amplifier circuits are connected in a voltage follower, input a plurality of analog signals in parallel and drive a plurality of data lines in parallel based on the plurality of analog signals. The common bias circuit generates the first bias signal set and the second bias signal set which is different the first bias signal set. Each of the plurality of differential AB class amplifier circuits includes an N-channel differential amplifier circuit, a P-channel differential amplifier circuit and an output stage circuit. The N-channel differential amplifier circuit is provided between a power supply terminal and a ground terminal, inputs a differential signal and outputs a first output signal onto a first output line based on the first bias signal set. The P-channel differential amplifier circuit is provided between the power supply terminal and the ground terminal in parallel to the N-channel differential amplifier circuit to operate independently from the N-channel differential amplifier circuit, inputs the differential signal and outputs a second output signal onto a second output line based on the first bias signal set. The output stage circuit generates an output signal from the first and second output signals based on the second bias signal set and outputs the output signal onto an output terminal.

Here, the N-channel differential amplifier circuit may contain an N-channel current source MOS transistor controlled based on a first bias signal of the first bias signal set, and the P-channel differential amplifier circuit may contain a P-channel current source MOS transistor controlled based on a second bias signal of the first bias signal set. In this case, the common bias circuit may set the first and second bias signals to a ground voltage level and a power supply voltage level in a test mode, respectively.

Also, the output stage circuit may include a pair of P-channel and N-channel output stage MOS transistors, a pair of P-channel and N-channel constant current MOS transistors, and a P-channel and N-channel shift MOS transistors. The P-channel output stage MOS transistor is connected between the power supply terminal and the output terminal and has a gate supplied with the first output signal, and the N-channel output stage MOS transistor is connected between the ground terminal and the output terminal and has a gate supplied with the second output signal. The P-channel constant current MOS transistor is connected between the power supply terminal and the first output line and has a gate supplied with a third bias signal of the second bias signal set, and the N-channel constant current MOS transistor is connected between the ground terminal and the second output line and has a gate supplied with a fourth bias signal as one of the bias signals of the second bias signal set. The P-channel and N-channel shift MOS transistors are connected in parallel between the first and second output lines to function as a level shifter. The P-channel shift MOS transistor has a gate supplied with a fifth bias signal of the second bias signal set, and the N-channel shift MOS transistor has a gate supplied with a sixth bias signal of the second bias signal set. In this case, the common bias circuit may set the third to sixth bias signals to a ground voltage level, a power supply voltage level, the power supply voltage level and the ground voltage level in a test mode, respectively.

Also, the common bias circuit may include a constant current source, a pair of P-channel and N-channel current mirror circuits, a first pair of P-channel and N-channel MOS transistors. The constant current source is provided between the power supply terminal and the ground terminal. Each of the pair of P-channel and N-channel current mirror circuits outputs a plurality of mirror current signals from a plurality of current mirror output terminals based on a circuit current of the constant current source. The P-channel MOS transistor of the first pair is connected between one of the plurality of current mirror output terminals of the N-channel current mirror circuit and the power supply terminal and has a gate and a drain which are connected in common, and the N-channel MOS transistor of the first pair is connected between one of the plurality of current mirror output terminals of the P-channel current mirror circuit and the ground terminal and has a gate and a drain which are connected in common. The first and second bias signals of the first bias signal set may be respectively outputted from the gates of the P-channel and N-channel MOS transistors of the first pair as first and second nodes.

Instead, the common bias circuit may include a constant current source, a pair of P-channel and N-channel current mirror circuits. The constant current source is provided between the power supply terminal and the ground terminal. Each of the pair of P-channel and N-channel current mirror circuits outputs a plurality of mirror current signals from a plurality of current mirror output terminals based on a circuit current of the constant current source. The first and second bias signals of the first bias signal set are respectively outputted from a first node between the constant current source and the P-channel current mirror circuit, and a second node between the P-channel and N-channel current mirror circuits.

In this case, the common bias circuit may further include a second pair of P-channel and N-channel MOS transistors, a series circuit of two P-channel MOS transistors, and a series circuit of two N-channel MOS transistors. The series circuit of two P-channel MOS transistors are connected in series between one of the plurality of current mirror output terminals of the N-channel current mirror circuit and the power supply terminal. Each of the two P-channel MOS transistors has a gate and a drain which are connected in common. The series circuit of two N-channel MOS transistors are connected in series between one of the plurality of current mirror output terminals of the P-channel current mirror circuit and the ground terminal. Each of the two N-channel MOS transistors has a gate and a drain which are connected in common. The P-channel MOS transistor of the second pair is connected between one of the plurality of current mirror output terminals of the N-channel current mirror circuit and the power supply terminal and has a gate and a drain which are connected in common. The N-channel MOS transistor of the second pair is connected between one of the plurality of current mirror output terminals of the P-channel current mirror circuit and the ground terminal and has a gate and a drain which are connected in common. The third and fourth bias signals of the second bias signal set are respectively outputted from third and fourth nodes as the gates of the P-channel and N-channel MOS transistors of the second pair. The fifth bias signal is outputted from a fifth node as the gate of one of the two P-channel MOS transistors of the series circuit on a side of the N-channel current mirror circuit and the sixth bias signal is outputted from a sixth node as the gate of one of the two N-channel MOS transistors of the series circuit on a side of the P-channel current mirror circuit.

Also, the common bias circuit may further include a first switch connected with the constant current source in series; a second switch connected in parallel to the P-channel current mirror circuit between the power supply terminal and the constant current source; a third switch connected in parallel to the N-channel current mirror circuit between the ground terminal and a node between the P-channel and N-channel current mirror circuits; and a fourth switch connected between the gate of the P-channel MOS transistor of the pair and the power supply terminal; and a fifth switch connected between the gate of the N-channel MOS transistor of the pair and the ground terminal. In this case, the first switch is opened in a test mode, and the second to fifth switches are closed in the test mode.

Also, the common bias circuit may further include a first switch connected with the constant current source in series; a second switch connected in parallel to the P-channel current mirror circuit between the power supply terminal and the constant current source; and a third switch connected in parallel to the N-channel current mirror circuit between the ground terminal and a node between the P-channel and N-channel current mirror circuits. In this case, the first switch is opened in a test mode, and the second and third switches are closed in the test mode.

Also, the common bias circuit may further include a sixth switch connected between the third node and the gate of the P-channel MOS transistor of the second pair; a seventh fourth switch connected between the fourth node and the gate of the N-channel MOS transistor of the second pair; an eighth switch connected between the third node and the ground terminal; a ninth switch connected between the fourth and the power supply terminal; a tenth switch connected between the fifth node and the power supply terminal; and an eleventh switch connected between the sixth node and the ground terminal. In this case, the sixth and seventh switches are opened in a test mode and the eighth to eleventh switches are closed in the test mode.

BRIEF DESCRIPTION OF THE DRAWINGS

FIG. 7 is a diagram showing switch control of the common bias circuit shown in FIGS. 5 and 6;

DESCRIPTION OF THE PREFERRED EMBODIMENTS

Figure 9:
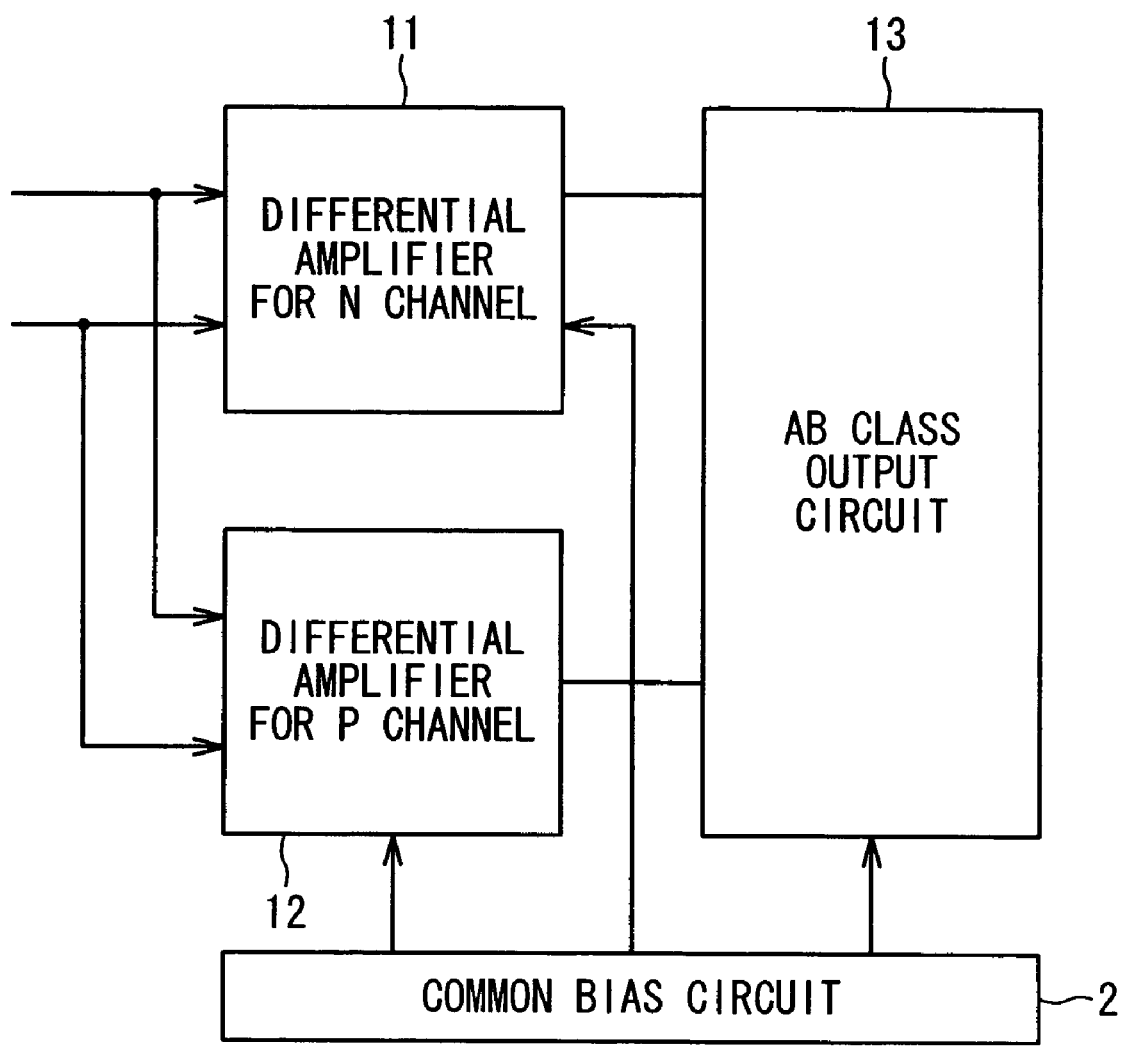
FIG. 9 is a block diagram showing the drive circuit of the present invention.

Hereinafter, a drive circuit of the present invention and a processing circuit using the drive circuit will be described in detail with reference to the attached drawings. Referring to FIG. 9, the drive circuit of the present invention is composed of a differential amplifier 11, a differential amplifier 12, an AB class output circuit 13, and a common bias circuit 2. The differential amplifier 11 and the differential amplifier 12 are independent from each other. The common bias circuit 2 supplies various bias voltage signals to the differential amplifier 11, the differential amplifier 12 and the AB class output circuit 13. In the drive circuit of the present invention, a circuit area and consumption power are reduced without damaging Rail-to-rail input/output characteristics of a differential AB class amplifier circuit. It should be noted that the drive circuit of a display unit will be described as a representative example of the drive circuit and processing circuit hereinafter.

Figure 1:
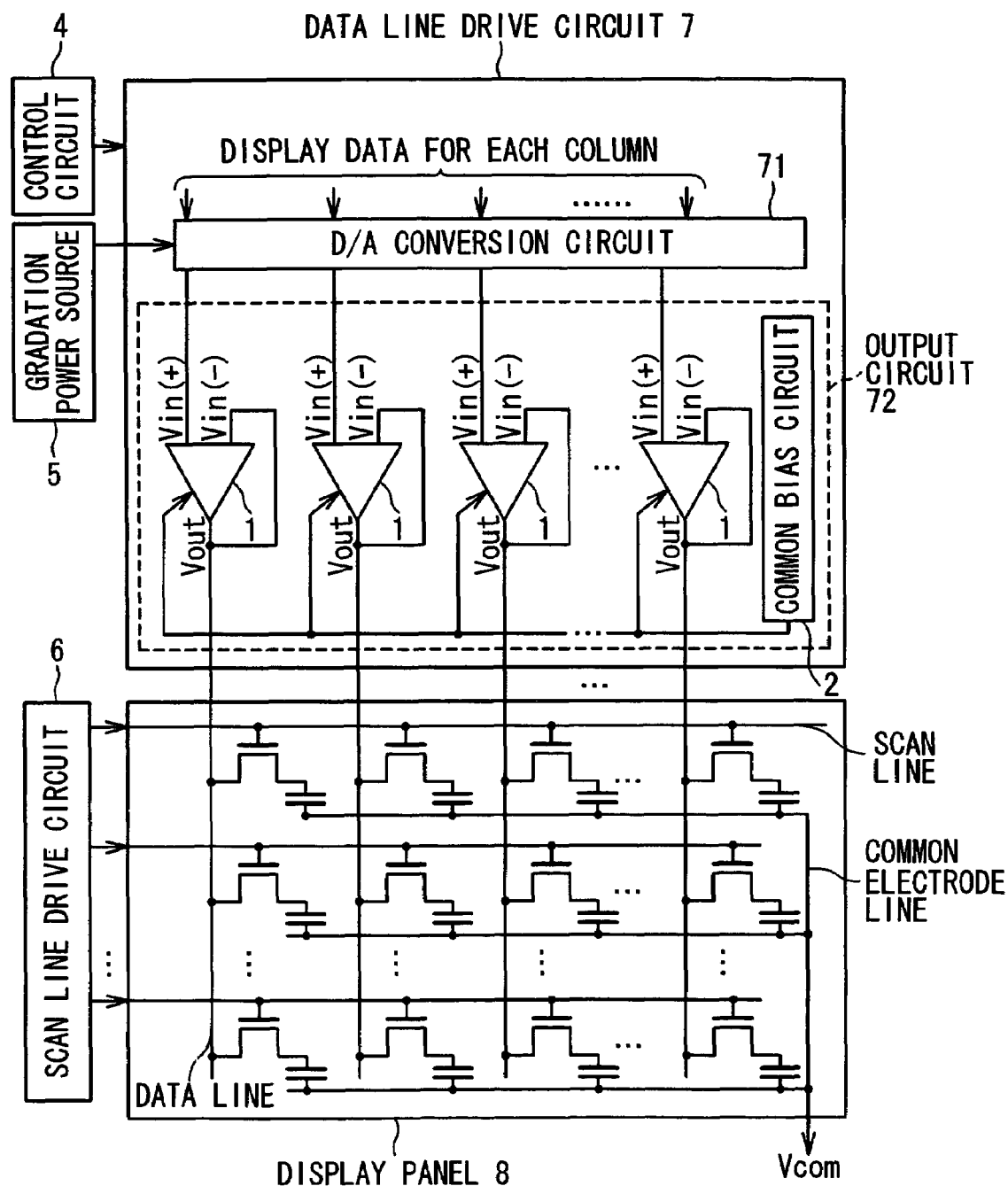
FIG. 1 is block diagram showing a display unit using a conventional drive circuit and a display panel.

The drive circuit of the present invention is composed of a plurality of differential AB class amplifier circuits 1 and a common bias circuit 2, like the output circuit 72 in the data line drive circuit 7 of the drive circuit of the conventional display unit shown in FIG. 1. The differential AB class amplifier circuit 1 can achieve the Rail-to-rail input/output, and the circuit structures of the differential AB class amplifier circuit 1 and the common bias circuit 2 are different from those in the conventional drive circuit. In the following embodiments, the structure and operation of the differential AB class amplifier circuits 1 and the common bias circuit 2 will be described with reference to the attached drawings.

[First Embodiment]

Figure 4:
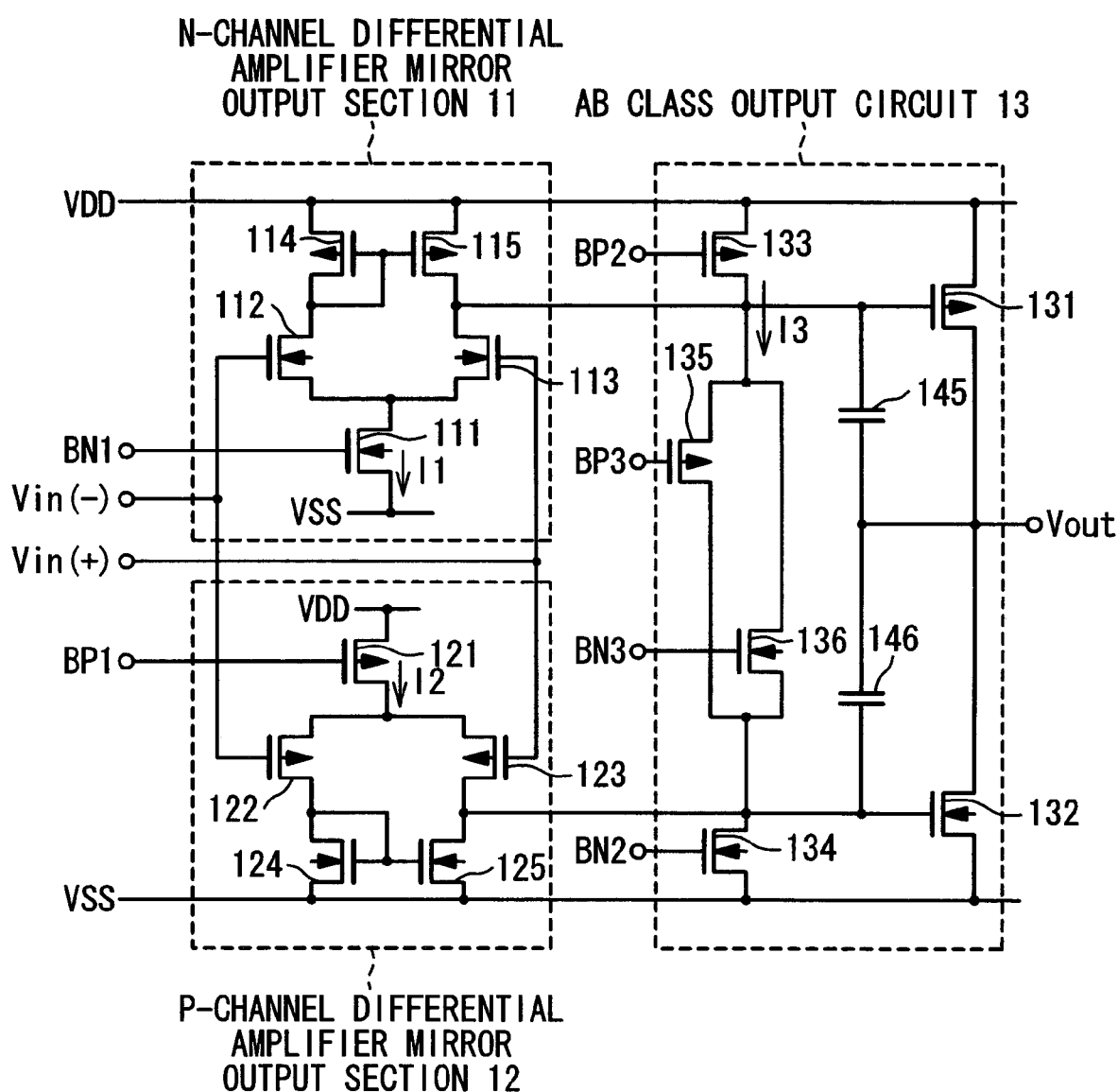
FIG. 4 is a circuit diagram showing the circuit structure of a differential AB class amplifier circuit of a drive circuit according to a first embodiment of the present invention.
Figure 5:
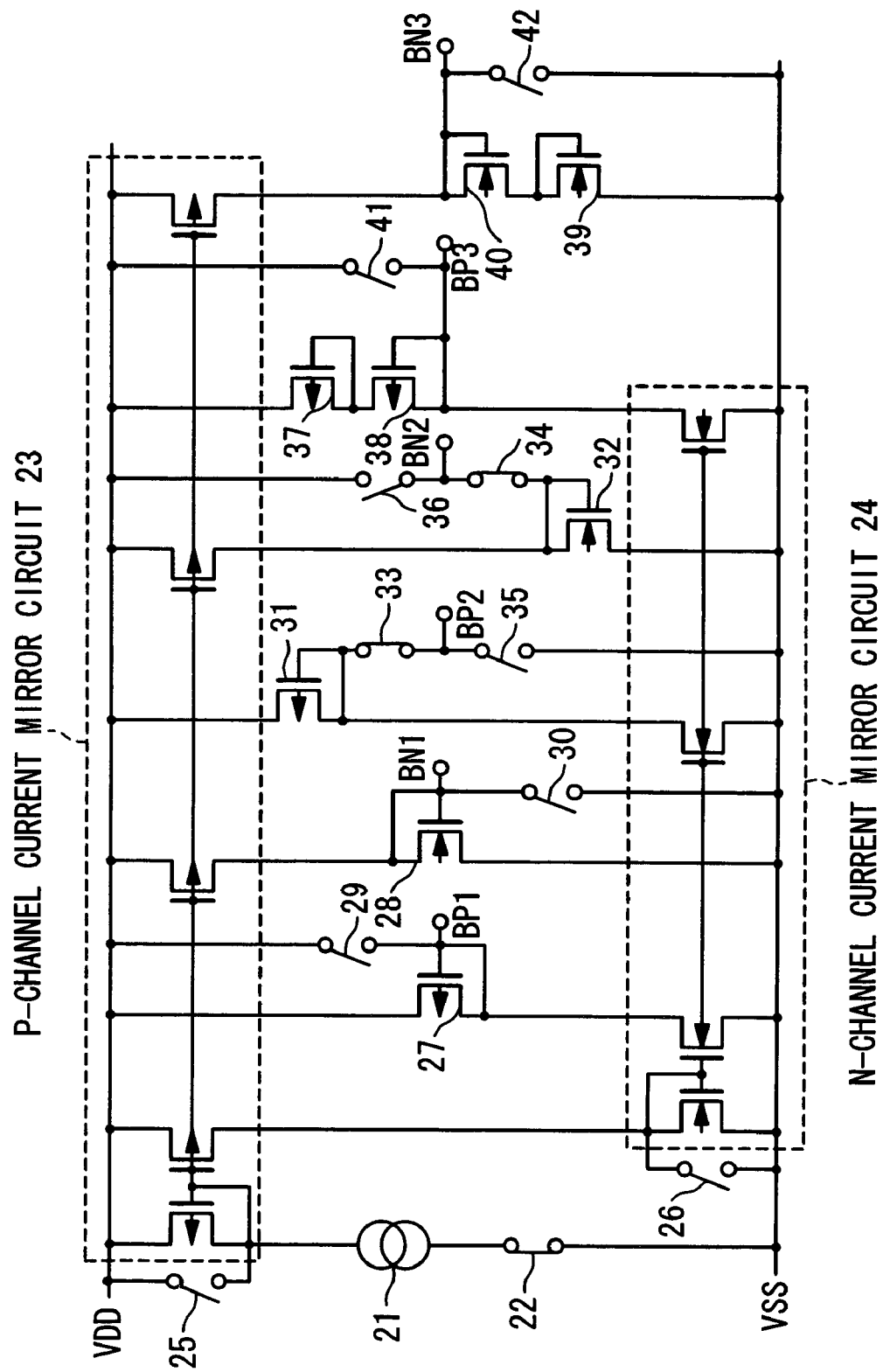
FIG. 5 is a circuit diagram showing the circuit structure of a common bias circuit of the drive circuit according to a first embodiment of the present invention.

FIG. 4 is a circuit diagram showing the circuit structure of the differential AB class amplifier circuit 1 and the common bias circuit 2 of the drive circuit according to the first embodiment of the present invention. FIG. 4 shows the differential AB class amplifier circuit 1 and FIG. 5 shows the common bias circuit 2.

Referring to FIG. 4, the differential AB class amplifier circuit 1 of the drive circuit in this embodiment is composed of a differential amplifier 11, a differential amplifier 12 and an AB class output circuit 13.

The differential amplifier 11 is composed of a pair of N-channel differential MOS transistors 112 and 113, a pair of P-channel load MOS transistors 114 and 115 of a current mirror type, an N-channel constant current source MOS transistor 111. The gates of the N-channel differential MOS transistors 112 and 113 are connected an inversion input terminal Vin(−) and a non-inversion input terminal Vin(+), respectively. The P-channel load MOS transistors 114 and 115 are connected with the N-channel differential MOS transistors 112 and 113. The N-channel constant current source MOS transistor 111 has a gate supplied with an N-channel differential bias voltage BN1 and supplies a constant current I1 to sources of the N-channel differential MOS transistors 112 and 113. The output is connected from the drain of the N-channel differential MOS transistor 113 to the gate of a P-channel output stage MOS transistor 131 of the AB class output circuit.

The differential amplifier 12 is composed of a pair of P-channel differential MOS transistors 122 and 123, a pair of N-channel load MOS transistors 124 and 125 of the current mirror type, and an N-channel constant current source MOS transistor 121. The gates of the P-channel differential MOS transistors 122 and 123 are connected with the inversion input terminal Vin(−) and the non-inversion input terminal Vin(+), respectively. The N-channel load MOS transistors 124 and 125 of the current mirror type are connected with the P-channel differential MOS transistors 122 and 123. The N-channel constant current source MOS transistor 121 has a gate for inputting a P-channel differential bias voltage BP1 and supplies a constant current I2 to sources of the pair of P-channel differential MOS transistors 122 and 123. The output is connected from the drain of the P-channel differential MOS transistor 123 to the gate of an N-channel output stage MOS transistor 132 of the AB class output circuit 13.

The AB class output circuit 13 is composed of a pair of P-channel and N-channel output stage MOS transistors 131 and 132, a pair of P-channel and N-channel constant current MOS transistors 133 and 134, and a pair of P-channel and N-channel shift MOS transistors 135 and 136. The P-channel and N-channel output stage MOS transistors 131 and 132 are connected between the output terminal and the power supply terminal and between the output terminal and the ground terminal. The gates of the P-channel and N-channel output stage MOS transistors 131 and 132 are connected with the output lines of the P-channel and N-channel differential amplifiers 11 and 12. The P-channel and N-channel constant current MOS transistors 133 and 134 are connected between the output line of the differential amplifier 11 and the power supply terminal and between the output line of the differential amplifier 12 and the ground terminal. The gates of the MOS transistors 133 and 134 are supplied with a pair of P-channel and N-channel constant current bias voltages BP2 and BN2, respectively. The P-channel and N-channel shift MOS transistors 135 and 136 are connected between the output lines of the differential amplifiers 11 and 12 and the gates of the MOS transistors 135 and 136 receive a pair of P-channel and N-channel constant current bias voltages BP3 and BN3 to function as level shifters.

In the AB class output circuit 13 of this embodiment, like the conventional example, a pair of mirror capacities 145 and 146 for the phase compensation are connected between the gates of the P-channel and N-channel output stage MOS transistors 131 and 132 and the output terminal Vout such that the differential AB class amplifier circuit 1 has a good frequency response.

Next, referring to FIG. 5, the common bias circuit 2 of the drive circuit of the present invention is composed of a constant current source 21, a switch 22, a pair of P-channel and N-channel current mirror circuits 23 and 24, and a pair of switches 25 and 26. The switch 22 is turned off in a test mode. The P-channel and N-channel current mirror circuits 23 and 24 output a plurality of mirror currents from the plurality of output terminals for every channel in accordance with the circuit current of a series circuit of the constant current source 21 and the switch 22. The switches 25 and 26 are connected between an input terminal of the P-channel current mirror circuit 23 and the power supply terminal and between the input terminal of the N-channel current mirror circuit 24 and the ground terminal for every channel. The switches 25 and 26 are turned on in the test mode.

The common bias circuit 2 is further composed of a pair of a pair of P-channel and N-channel MOS transistors 27 and 28, and a pair of switches 29 and 30. The P-channel and N-channel MOS transistors 27 and 28 are connected between an output terminal of the N-channel current mirror circuit 24 and the power supply terminal and between an output terminal of the P-channel current mirror circuit 23 and the ground terminal for every channel and in each of which a gate. The drain and gate of each of the P-channel and N-channel MOS transistors 27 and 28 are connected in common. The switch 29 is connected between the gate of the P-channel MOS transistor 27 and the power supply terminal 28 and the switch 30 is connected between the gate of the N-channel MOS transistor 28 and the ground terminal. The gates of the MOS transistors 27 and 28 are output nodes of the P-channel and N-channel differential bias voltages BP1 and BN1 for every channel. The switches 29 and 30 are turned on in the test mode. In the test mode, the P-channel and N-channel differential bias voltages BP1 and BN1 of the power supply level and the ground level are outputted.

Also, the common bias circuit 2 is further composed of a pair of P-channel and N-channel MOS transistors 31 and 32, a pair of switches 33 and 34, and a pair of switches 35 and 36. The P-channel and N-channel MOS transistors 31 and 32 are connected between an output terminal of the N-channel current mirror circuit 24 and the power supply terminal and between an output terminal of the P-channel current mirror circuit 23 and the ground terminal for every channel. The drain and gate of the P-channel MOS transistor 31 are connected in common and the drain and gate of the N-channel MOS transistor 32 are connected in common. The switches 33 and 34 are connected with the gates of the MOS transistors 31 and 32, respectively and turned off in the test mode. The switch 35 is connected between the switch 33 and the ground terminal and the switch 36 is connected between the switch 34 and the power supply terminal. Nodes between the switches 33 and 35 and the between the switches 34 and 36 function as output nodes of the P-channel and N-channel constant current bias voltages BP2 and BN2. The switches 35 and 36 are turned on in the test mode. In the test mode, the P-channel and N-channel constant current bias voltages BP2 and BN2 of the ground level and the power supply level are outputted.

Also, the common bias circuit 2 is further composed of a pair of a series circuit of two P-channel MOS transistors 37 and 38 and a series circuit of two N-channel MOS transistors 39 and 40, and a pair of switches 41 and 42. In the series circuits of the two P-channel MOS transistors 37 and 38, a gate and a drain are connected in common in each MOS transistor. In the series circuits of the two N-channel MOS transistors 40 and 39, a gate and a drain are connected in common in each MOS transistor. The series circuits of the two P-channel MOS transistors 37 and 38 is connected between the output terminal of the N-channel current mirror circuit 24 and the power supply terminal for every channel, and the series circuits of the two N-channel MOS transistors 40 and 39 is connected between the output terminal of P-channel current mirror circuit 23 and the ground terminal for every channel. The switches 41 and 42 are provided in parallel to the series circuits, respectively. The gate of the MOS transistor 38 and the gate of the transistor 40 function as output nodes of the P-channel and N-channel shift bias voltages BP3 and BN3. The switches 41 and 42 are turned in the test mode. In the test mode, the P-channel and N-channel shift bias voltages BP3 and BN3 of the power supply level and the ground level are outputted. It should be noted that each switch in the common bias circuit 2 is composed of P-channel or N-channel MOS transistor.

Next, the operation of the differential AB class amplifier circuit 1 of the drive circuit in this embodiment will be described. The switches of the drive circuit are operated as shown in FIG. 7. In the differential amplifier 11 of the differential AB class amplifier circuit 1 in this embodiment, the constant current source of the differential stage is composed of the N-channel constant current MOS transistor 111. Therefore, an input signal in a voltage range from the power supply terminal VDD to [Vgs1+Vds1 (sat)] is amplified and transferred to the AB class output circuit 13. In this case, Vds1 (sat) is a voltage between the source and drain of the N-channel constant current MOS transistor 111 in the saturated region operation, and Vgs1 is a voltage between the source and gate of the N-channel differential MOS transistor 112 or 113 when the bias current I1 flows through the N-channel differential MOS transistor 112 or 113.

Also, in the differential amplifier 12, the constant current source of the differential stage is composed of the P-channel constant current MOS transistor 121. Therefore, an input signal in a voltage range from VDD−[Vgs2+Vds2 (sat)] to the ground potential VSS is amplified and transferred to the AB class output circuit 13. In this case, Vds2 (sat) is a voltage between the source and drain of the P-channel constant current MOS transistor 121 in the saturated region, and Vgs2 is a voltage between the source and gate in the P-channel differential MOS transistor 122 or 123 when the bias current I2 flows through P-channel differential MOS transistor 122 or 123.

Figure 6:
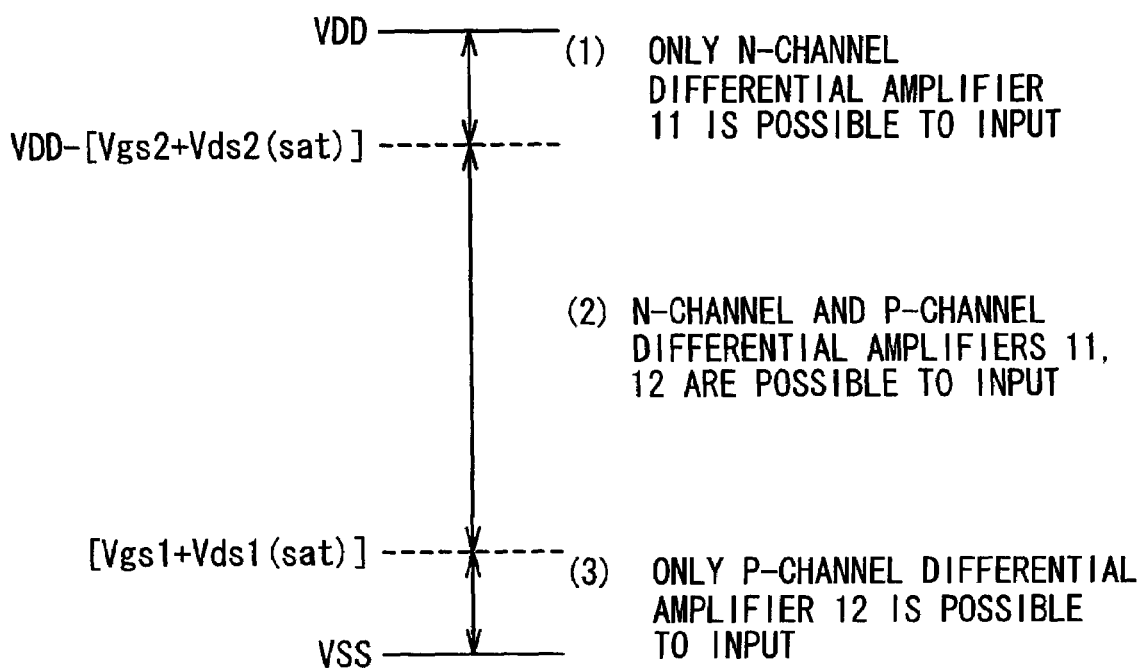
FIG. 6 is a diagram showing an operation mode of the differential AB class amplifier circuit shown in FIGS. 5 and 6.

FIG. 6 is a diagram showing an operation mode of the differential AB class amplifier circuit 1 of this embodiment, and the input voltage range of the input signals Vin(+), Vin(−) to the differential AB class amplifier circuit 1 is shown in a vertical direction.

The differential AB class amplifier circuit 1 of this embodiment has three operation modes (1)–(3) in accordance with the input voltage range of input signals Vin(+) and Vin(−).

Operation mode (1) corresponds to the input voltage range of the input signal Vin(+) and Vin(−) higher than VDD−[Vgs2+Vds2 (sat)] and lower than VDD. In this input voltage range, the normal operation of the P-channel constant current MOS transistor 121 of the differential amplifier 12 is impossible because it is outside a permission input voltage range. However, at this time, because the N-channel constant current MOS transistor 111 of the differential amplifier 11 operates within the permission input voltage range, the signal is transferred from differential amplifier 11 to the AB class output circuit 13 and functions as the differential AB class amplifier circuit normally.

Operation mode (2) corresponds to the input voltage range of the input signals Vin(+), Vin(−) higher than [Vgs1+Vds1 (sat)] and lower than VDD−[Vgs2+Vds2 (sat)]. In this input voltage range, the differential amplifiers 11 and 12 and the P-channel and N-channel constant current MOS transistors 111 and 121 are within a permission input voltage range. Therefore, both of the differential amplifiers 11 and 12 operate normally. Signals are transferred from the differential amplifiers 11 and 12 to the AB class output circuit 13 so that the circuit operates normally as the differential AB class amplifier circuit.

Operation mode (3) corresponds to the input voltage range of the input signals Vin(+), Vin(−) equal to or higher than ground voltage VSS and equal to or lower than [Vgs1+Vds1 (sat)]. In this input voltage range, the N-channel constant current MOS transistor 111 of the differential amplifier 11 is outside the permission input voltage range so that the normal operation is impossible. However, in this time, the P-channel constant current MOS transistor 121 of the differential amplifier 12 is inside the permission input voltage range. Therefore, the input signal is transferred to the AB class output circuit 13 by the differential amplifier 12 so that the circuit operates normally as the differential AB class amplifier circuit.

In this way, in the differential AB class amplifier circuit of this embodiment, even if the input signal is outside the permission input voltage range, so that one of the differential amplifiers 11 and 12 does not operate normally, but the other differential amplifier operates normally. Therefore, it is possible to transfer a signal to the AB class output circuit 13 in any input voltage range from power supply terminal VDD to the ground terminal VSS, like the conventional example. That is, the Rail-to-rail input is possible.

Figure 2:
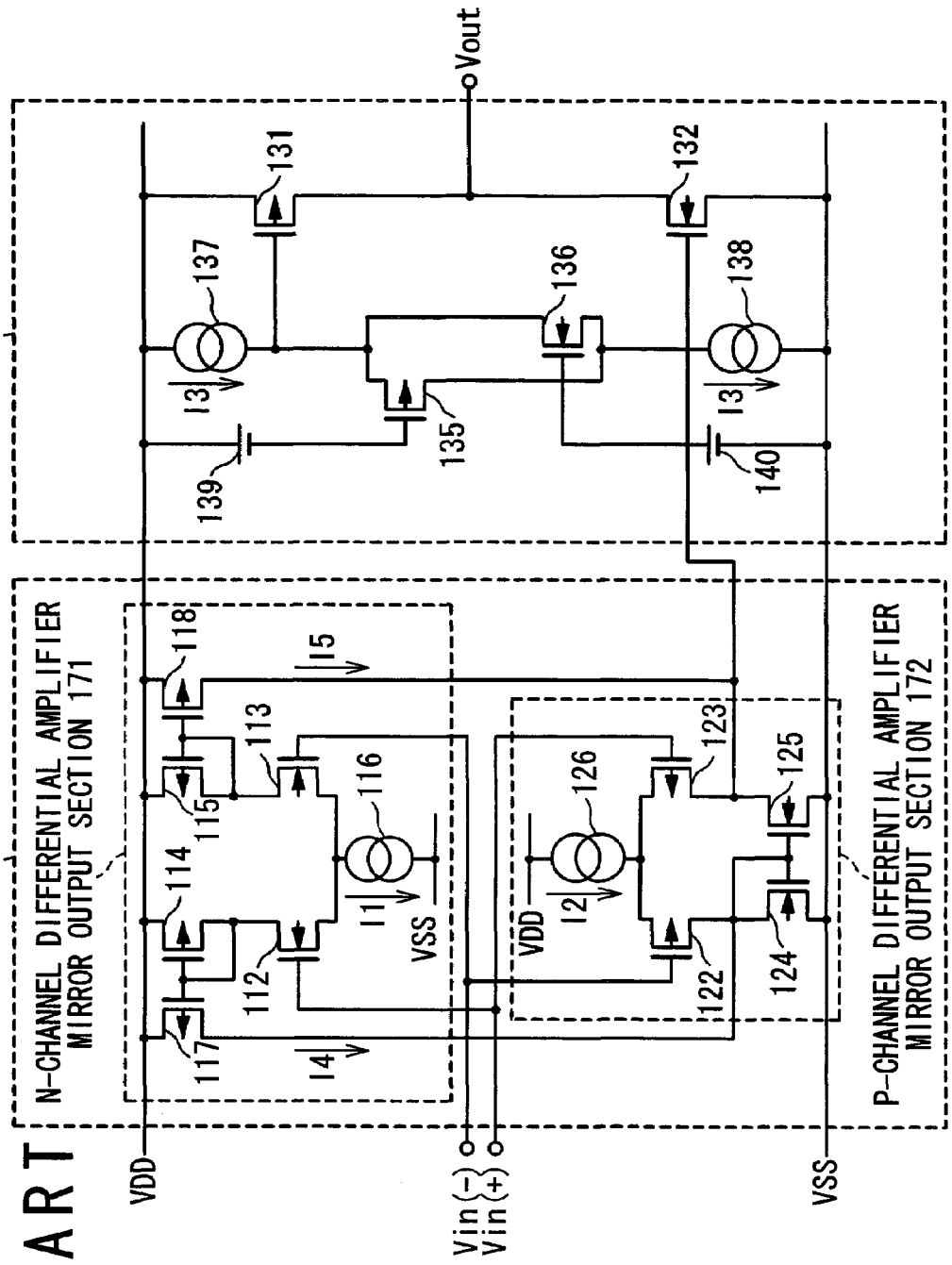
FIG. 2 is a circuit diagram showing a first conventional example of differential AB class amplifier circuit.
Figure 3:
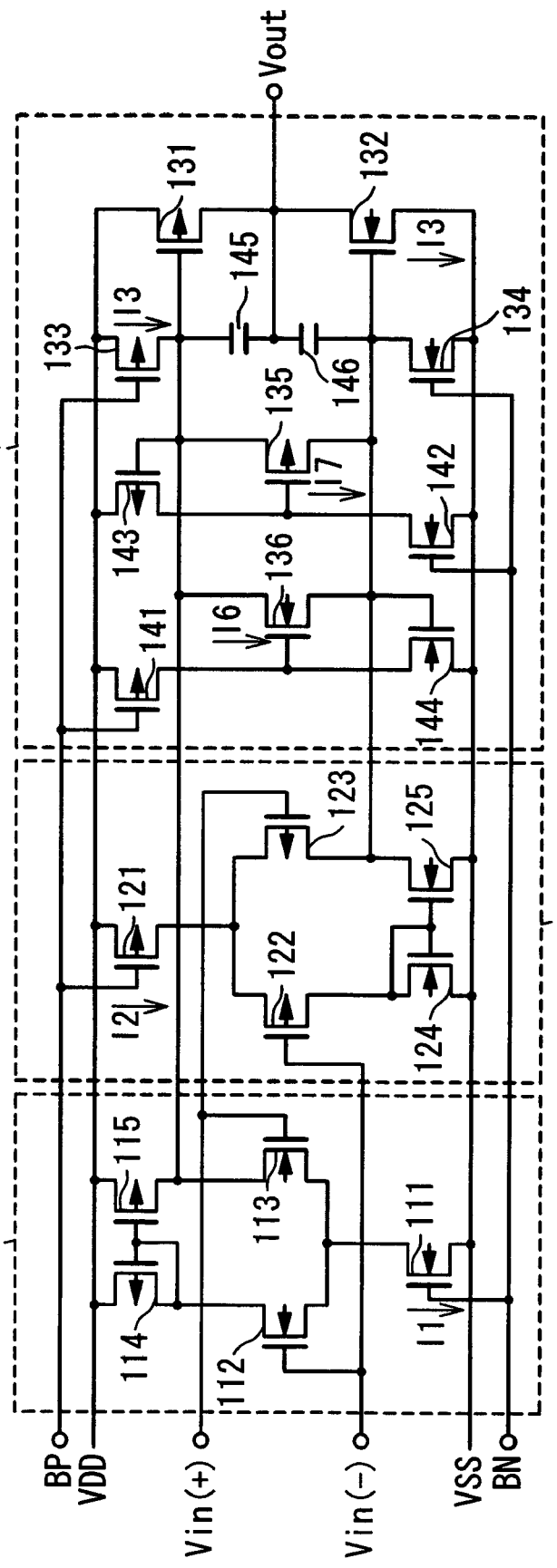
FIG. 3 is a circuit diagram showing a second conventional example of the differential AB class amplifier circuit.

Also, in the first conventional example shown in FIG. 2, the folded mirror circuit is conventionally required in the differential amplifier section of the differential AB class amplifier circuit. Four mirror output MOS transistors are needed to the control the gate voltages of a pair of P-channel and N-channel shift MOS transistors of the AB class output circuit of the differential AB class amplifier circuit in the second conventional example shown in FIG. 3. However, these circuits are made unnecessary in the present invention. As a result, the number of elements in the differential AB class amplifier circuit decreases, and the current paths of the currents I4 to I7 shown in FIGS. 2 and 3 are not used. Therefore, a circuit area is reduced, and the high density integration and low power consumption of the drive circuit become possible. Especially, the circuit area and power consumption of the drive circuit of the display unit are remarkably reduced, because 300 to 500 differential AB class amplifier circuits per chip are used in the data line drive circuit of the drive circuit of the display unit.

Next, the operation of the common bias circuit 2 of the drive circuit in this embodiment will be described. The common bias circuit 2 of the drive circuit in this embodiment carries out switch control in which the P-channel and N-channel differential bias voltages, the P-channel and N-channel constant current bias voltages, and the P-channel and N-channel shift bias voltages is set to the power supply level or the ground level in the test mode.

FIG. 3 is a diagram showing the switch control by the common bias circuit 2 of the drive circuit in this embodiment, and showing an on/off state of the switch in the test mode and a normal operation mode. It should be noted that the on/off state of each switch in the common bias circuit 2 shown in FIG. 5 shows the on/off state in the normal operation mode.

In the common bias circuit 2 shown in FIG. 5, three switches 22, 33, and 34 are turned on. The other switches are turned off. The P-channel and N-channel current mirror circuits 23 and 24 output a plurality of mirror currents from the plurality of output terminals in correspondence to the constant current source 21. The P-channel and N-channel MOS transistors 27 and 28 constitute mirror circuits for every channel together with the P-channel and N-channel constant current MOS transistors 121 and 111 of the differential amplifiers 12 and 11. The P-channel and N-channel MOS transistors 27 and 28 generate P-channel and N-channel differential bias voltages BP1 and BN1 as threshold voltages for one stage of a diode connection MOS transistor, and output to the P-channel and N-channel constant current MOS transistors 121 and 111. The P-channel and N-channel constant current MOS transistors 121 and 111 flow bias currents I2 and I1.

The P-channel and N-channel MOS transistors 31 and 32 constitute current mirror circuits for every channel together with the P-channel and N-channel constant current MOS transistors 133 and 134 of the AB class output circuit 13. The P-channel and N-channel MOS transistors 31 and 32 generate P-channel and N-channel constant current bias voltages BP2 and BN2 as threshold voltages for one stage of a diode connection MOS transistor, and output to the P-channel and N-channel constant current MOS transistors 133 and 134. The P-channel and N-channel constant current MOS transistor 133 and 134 flow bias current I3.

The two P-channel MOS transistors 37 and 38 and the two N-channel MOS transistors 39 and 40 generate the P-channel and N-channel shift bias voltages BP3 and BN3 as threshold voltages for two stages of a diode connection MOS transistor, and outputs to the P-channel and N-channel shift MOS transistors 135 and 136 of the AB class output circuit 13. These P-channel and N-channel shift MOS transistors 135 and 136 function as a level shifter.

Also, in the common bias circuit 2 shown in FIG. 5, in the test mode, three switches 22, 33, and 34 are turned off and the other switches are turned on. Thus, all the circuit current paths in the common bias circuit 2 are blocked off. Moreover, the N-channel and P-channel differential bias voltages BN1 and BP1 are switched to the ground level and the power supply level respectively, the P-channel and N-channel constant current bias voltages BP2 and BN2 are switched to the ground level and the power supply level, respectively. Also, the P-channel and N-channel shift bias voltages BP3 and BN3 are switched to the power supply level and the ground level, respectively. Therefore, the P-channel and N-channel constant current MOS transistors 121 and 111 of the differential amplifiers 12 and 11 are turned off in the differential AB class amplifier circuit 1. Also, the P-channel and N-channel constant current MOS transistors 133 and 134 of the AB class output circuit 13 are turned on. The P-channel and N-channel shift MOS transistors 135 and 136 of the AB class output circuit 13 are turned off. The gates of the P-channel and N-channel output stage MOS transistors 131 and 132 are fixed on the power supply level and the ground level to fully turn off the P-channel and N-channel output stage MOS transistors 131 and 132, so that all the circuit current paths of the differential AB class amplifier circuit 1 are turned off. In this way, in the test mode, the circuit current of the drive circuit becomes zero so that leak current measurement of the drive circuit becomes possible.

Conventionally, when the differential AB class amplifier circuit is used as the output circuit of the data line drive circuit, in order to turn off all the circuit current paths in the test mode, the P-channel and N-channel test MOS transistors are provided between the gate of the P-channel output stage MOS transistor 131 and the power supply terminal and between the gate of the N-channel output stage MOS transistor 132 and the ground terminal, to fix the gate voltages of the P-channel and N-channel output stage MOS transistors 131 and 132 on the power supply level and the ground level. However, in the differential AB class amplifier circuit of the present invention, the P-channel and N-channel shift MOS transistors 135 and 136 are turned off and the P-channel and N-channel constant current MOS transistors 133 and 134 are turned on. As a result, the gate voltages of the P-channel and N-channel output stage MOS transistor 131 and 132 can be fixed on the power supply level and the ground level. It is not necessary to add the P-channel and N-channel test MOS transistors, unlike the conventional example. Also, the circuit area is reduced for the two elements in the differential AB class amplifier circuit. Especially, the circuit area of the drive circuit of the display unit can be remarkably reduced because 300 to 500 differential AB class amplifier circuits per chip are used in the drive circuit of the display unit, and the drive circuit of the display unit can be highly integrated.

It should be noted that the common bias circuit of this embodiment shown in FIG. 5 is the control circuit in which many switches are used and various modifications could be thought of.

Figure 8:
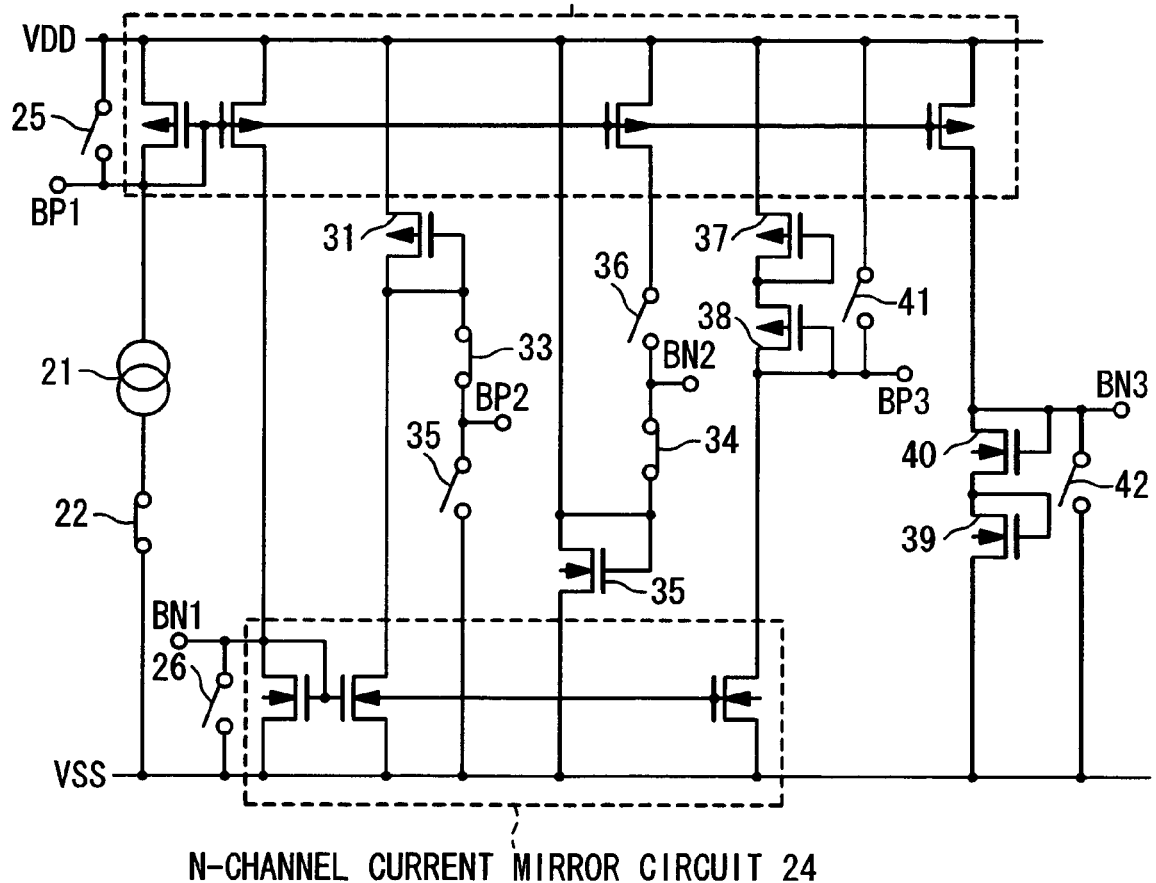
FIG. 8 is a circuit diagram showing a modification of the common bias circuit shown in FIG. 6.

For example, FIG. 8 is a circuit diagram showing a modification of the common bias circuit 2 in the drive circuit of the present invention. In the common bias circuit 2 of this modification, the P-channel and N-channel MOS transistors 27 and 28, the switches 29 and 30 and the two mirror output MOS transistors of the P-channel and N-channel current mirror circuits are removed. Input terminals of the P-channel and N-channel current mirror circuits function as output nodes of the P-channel and N-channel differential bias voltages BP1 and BN1, compared with the common bias circuit shown in FIG. 5. In the common bias circuit 2 of this modification, the P-channel and N-channel differential bias voltages BP1 and BN1, the P-channel and N-channel constant current bias voltages BP2 and BN2, and the P-channel and N-channel shift bias voltages BP3 and BN3 must be designed in order. However, the circuit area can be more reduced than the common bias circuit shown in FIG. 5.

Also, in the above-mentioned embodiments or modifications, the drive circuit having a plurality of differential AB class amplifier circuits and the common bias circuit is described. However, the present invention is not limited to these embodiments. It could be understood that the same effect as that of the drive circuit can be achieved in the processing circuit which contains the plurality of differential AB class amplifier circuits which amplify a plurality of analog signals in parallel, and the common bias circuit which supplies the bias voltage to the plurality of differential AB class amplifier circuits in common.

Also, in the above-mentioned embodiments, the drive circuit which contains the plurality of differential AB class amplifier circuits is described. However, the present invention is not limited to the embodiments. It could be understood that the same effect as that of the drive circuit can be achieved in various circuits in which the differential AB class amplifier circuit is controlled based on the P-channel and N-channel bias voltages.

In the drive circuit and processing circuit of the present invention, the number of elements and the circuit current paths are reduced in the differential AB class amplifier circuit with the Rail-to-rail input/output. A circuit area and consumption power are reduced and the high integration of the drive circuit and processing circuit can be realized. That is, in the differential AB class amplifier circuit in the drive circuit of the present invention, the folded mirror circuit becomes unnecessary although it is necessary in the differential amplifier section of the differential AB class amplifier circuit in the first conventional example shown in FIG. 2. Also, four mirror output MOS transistors which are necessary in the AB class output circuit of the differential AB class amplifier circuit of the second conventional example shown in FIG. 3 to control the gate voltages of the P-channel and N-channel shift MOS transistors become unnecessary in the present invention. Therefore, the number of elements in the differential AB class amplifier circuit decreases. Also, there are not the current paths of the current I4–I7 shown in FIGS. 2 and 3. Therefore, a circuit area and power consumption are reduced and high integration of the drive circuit can be achieved.

Also, conventionally, when the differential AB class amplifier circuit is used as the output circuit of the data line drive circuit, the P-channel and N-channel test MOS transistors are added between the gate of the P-channel output stage MOS transistor and the power supply terminal and between the gate of the N-channel output stage MOS transistor and the ground terminal, and the gate voltages of the P-channel and the N-channel output stage MOS transistors are fixed to the power supply level and the ground level, in order to block off all the circuit current paths in the test mode. However, in the differential AB class amplifier circuit of the present invention, the addition of the P-channel and N-channel test MOS transistors becomes unnecessary and the number of elements of the differential AB class amplifier circuit is decreased by two so that a circuit area is reduced. Especially, in the drive circuit for the display unit, in which 300–500 differential AB class amplifier circuits per chip are used, the circuit area and the power consumption of the drive circuit are remarkably reduced.

What is claimed is:

1. A drive circuit comprising:
    a plurality of differential AB class amplifier circuits connected in parallel, wherein each of the plurality of differential AB class amplifier circuits is configured as a voltage follower to input one of a plurality of analog signals and drive one of a plurality of data lines based on said one of a plurality of analog signals; and
    a common bias circuit which generates a first bias signal set and a second bias signal set, said first bias signal set comprising a first bias signal and a second bias signal, wherein said common bias circuit sets said first and second bias signals to one of a ground voltage level and a power supply voltage level in a test mode;
    wherein each of said plurality of differential AB class amplifier circuits comprises:
    an N-channel differential amplifier circuit connected between a power supply terminal and a ground terminal, said N-channel differential amplifier circuit being capable of inputting a differential signal and outputting a first output signal onto a first output line based on said first bias signal set, wherein said N-channel differential amplifier circuit contains an N-channel current source MOS transistor controlled based on said first bias signal of said first bias signal set;

a P-channel differential amplifier circuit connected between said power supply terminal and said ground terminal in parallel to said N-channel differential amplifier circuit to operate independently from said N-channel differential amplifier circuit, said P-channel differential amplifier circuit being capable of inputting said differential signal and outputting a second output signal onto a second output line based on said first bias signal set, wherein said P-channel differential amplifier circuit contains a P-channel current source MOS transistor controlled based on said second bias signal of said first bias signal set; and an output stage circuit capable of generating a drive signal from said first and second output signals based on said second bias signal set and outputting said drive signal onto an output terminal.

2. A drive circuit comprising:

a plurality of differential AB class amplifier circuits connected in parallel, wherein each of the plurality of differential AB class amplifier circuits is configured as a voltage follower to input one of a plurality of analog signals and drive one of a plurality of data lines based on said one of a plurality of analog signals; and a common bias circuit which generates a first bias signal set and a second bias signal set, said second bias signal set comprising third, fourth, fifth and sixth bias signals, wherein said common bias circuit sets said third, fourth, fifth and sixth bias signals to one of a power supply voltage level and a ground voltage level in a test mode;

wherein each of said plurality of differential AB class amplifier circuits comprises:

an N-channel differential amplifier circuit connected between a power supply terminal and a ground terminal, said N-channel differential amplifier circuit being capable of inputting a differential signal and outputting a first output signal onto a first output line based on said first bias signal set;

a P-channel differential amplifier circuit connected between said power supply terminal and said ground terminal in parallel to said N-channel differential amplifier circuit to operate independently from said N-channel differential amplifier circuit, said P-channel differential amplifier circuit being capable of inputting said differential signal and outputting a second output signal onto a second output line based on said first bias signal set; and an output stage circuit capable of generating a drive signal from said first and second output signals based on said second bias signal set and outputting said drive signal onto an output terminal, wherein said output stage circuit comprises:

a pair of P-channel and N-channel output stage MOS transistors, wherein said P-channel output stage MOS transistor is connected between said power supply terminal and said output terminal and has a gate supplied with said first output signal, and said N-channel output stage MOS transistor is connected between said ground terminal and said output terminal and has a gate supplied with said second output signal;

a pair of P-channel and N-channel constant current MOS transistors, wherein said P-channel constant current MOS transistor is connected between said power supply terminal and said first output line and has a gate supplied with said third bias signal of said second bias signal set, and said N-channel constant current MOS transistor is connected between said ground terminal and said second output line and has a gate supplied with said fourth bias signal as one of the bias signals of said second bias signal set; and P-channel and N-channel shift MOS transistors connected in parallel between said first and second output lines to function as a level shifter, wherein said P-channel shift MOS transistor has a gate supplied with said fifth bias signal of said second bias signal set, and said N-channel shift MOS transistor has a gate supplied with said sixth bias signal of said second bias signal set.

3. A drive circuit comprising:

a plurality of differential AB class amplifier circuits connected in parallel, wherein each of the plurality of differential AB class amplifier circuits is configured as a voltage follower to input one of a plurality of analog signals and drive one of a plurality of data lines based on said one of a plurality of analog signals; and a common bias circuit which generates a first bias signal set and a second bias signal set, said first bias signal set comprising a first bias signal and a second bias signal, wherein said common bias circuit comprises:

a constant current source provided between a power supply terminal and a ground terminal;

a pair of P-channel and N-channel current mirror circuits, capable of outputting a plurality of mirror current signals from a plurality of current mirror output terminals based on a circuit current of said constant current source; and a first pair of P-channel and N-channel MOS transistors, wherein said P-channel MOS transistor of said first pair is connected between one of said plurality of current mirror output terminals of said N-channel current mirror circuit and said power supply terminal and has a gate and a drain connected in common, and said N-channel MOS transistor of said first pair is connected between one of said plurality of current mirror output terminals of said P-channel current mirror circuit and said ground terminal and has a gate and a drain connected in common, wherein said first bias signal and said second bias signal are outputted as said first bias signal set from said gates of said P-channel and N-channel MOS transistors of said first pair as first and second nodes;

wherein each of said plurality of differential AB class amplifier circuits comprises:

an N-channel differential amplifier circuit connected between said power supply terminal and said ground terminal, said N-channel differential amplifier circuit being capable of inputting a differential signal and outputting a first output signal onto a first output line based on said first bias signal set;

a P-channel differential amplifier circuit connected between said power supply terminal and said ground terminal in parallel to said N-channel differential amplifier circuit to operate independently from said N-channel differential amplifier circuit, said P-channel differential amplifier circuit being capable of inputting said differential signal and outputting a second output signal onto a second output line based on said first bias signal set; and an output stage circuit configured to generate a drive signal from said first and second output signals based on said second bias signal set and outputting said drive signal onto an output terminal.

4. The drive circuit according to claim 3, wherein said common bias circuit further comprises:
a first switch connected with said constant current source in series;
a second switch connected in parallel to said P-channel current mirror circuit between said power supply terminal and said constant current source;
a third switch connected in parallel to said N-channel current mirror circuit between said ground terminal and a node between said P-channel and N-channel current mirror circuits;
a fourth switch connected between said gate of said P-channel MOS transistor of said pair and said power supply terminal; and
a fifth switch connected between said gate of said N-channel MOS transistor of said pair and said ground terminal.

5. The drive circuit according to claim 4, wherein said first switch is opened in a test mode, and said second, third, fourth and fifth switches are closed in said test mode.

6. A drive circuit comprising:
a plurality of differential AB class amplifier circuits connected in parallel, wherein each of the plurality of differential AB class amplifier circuits is configured as a voltage follower to input one of a plurality of analog signals and drive one of a plurality of data lines based on said one of a plurality of analog signals; and
a common bias circuit which generates a first bias signal set and a second bias signal set, said first bias signal set comprising a first bias signal and a second bias signal, wherein said common bias circuit comprises:
a constant current source provided between a power supply terminal and a ground terminal; and
a pair of P-channel and N-channel current mirror circuits, each capable of outputting a plurality of mirror current signals from a plurality of current mirror output terminals based on a circuit current of said constant current source,
wherein said first bias signal and said second bias signal are respectively output as said first bias signal set from a first node between said constant current source and said P-channel current mirror circuit, and a second node between said P-channel and N-channel current mirror circuits;
wherein each of said plurality of differential AB class amplifier circuits comprises:
an N-channel differential amplifier circuit connected between a power supply terminal and a ground terminal, said N-channel differential amplifier circuit being capable of inputting a differential signal and outputting a first output signal onto a first output line based on said first bias signal set;
a P-channel differential amplifier circuit connected between said power supply terminal and said ground terminal in parallel to said N-channel differential amplifier circuit to operate independently from said N-channel differential amplifier circuit, said P-channel differential amplifier circuit being capable of inputting said differential signal and outputting a second output signal onto a second output line based on said first bias signal set; and an output stage circuit configured to generate a drive signal from said first and second output signals based on said second bias signal set and outputting said drive signal onto an output terminal.

7. The drive circuit according to claim 6, wherein said common bias circuit further comprises:
a first switch connected with said constant current source in series;
a second switch connected in parallel to said P-channel current mirror circuit between said power supply terminal and said constant current source; and
a third switch connected in parallel to said N-channel current mirror circuit between said ground terminal and a node between said P-channel and N-channel current mirror circuits.

8. The drive circuit according to claim 7, wherein said first switch is opened in a test mode, and said second and third switches are closed in said test mode.

9. The drive circuit according to claim 3, wherein said common bias circuit further comprises:
a second pair of P-channel and N-channel MOS transistors;
a series circuit comprising two P-channel MOS transistors connected in series between one of said plurality of current mirror output terminals of said N-channel current mirror circuit and said power supply terminal, each P-channel MOS transistor having a gate and a drain connected in common; and
a series circuit comprising two N-channel MOS transistors connected in series between one of said plurality of current mirror output terminals of said P-channel current mirror circuit and said ground terminal, each N-channel MOS transistor having a gate and a drain connected in common,
wherein said P-channel MOS transistor of said second pair is connected between one of said plurality of current mirror output terminals of said N-channel current mirror circuit and said power supply terminal and has a gate and a drain connected in common,
wherein said N-channel MOS transistor of said second pair is connected between one of said plurality of current mirror output terminals of said P-channel current mirror circuit and said ground terminal and has a gate and a drain connected in common,
wherein a third bias signal and a fourth bias signal are respectively output as a part of said second bias signal set from third and fourth nodes as said gates of said P-channel and N-channel MOS transistors of said second pair, and
a fifth bias signal is output as a part of said second bias signal set from a fifth node as said gate of one of said two P-channel MOS transistors of said series circuit on a side of said N-channel current mirror circuit and a sixth bias signal is output as a part of said second bias signal set from a sixth node as said gate of one of said two N-channel MOS transistors of said series circuit on a side of said P-channel current mirror circuit.

10. The drive circuit according to claim 9, wherein said common bias circuit further comprises:
a sixth switch connected between said third node and said gate of said P-channel MOS transistor of said second pair;

a seventh switch connected between said fourth node and said gate of said N-channel MOS transistor of said second pair;

an eighth switch connected between said third node and said ground terminal;

a ninth switch connected between said fourth and said power supply terminal;

a tenth switch connected between said fifth node and said power supply terminal; and an eleventh switch connected between said sixth node and said ground terminal.

11. The drive circuit according to claim 10, wherein said sixth and seventh switches are opened in a test mode and said eighth, ninth, tenth and eleventh switches are closed in said test mode.

12. The drive circuit according to claim 6, wherein said common bias circuit further comprises:

a second pair of P-channel and N-channel MOS transistors;

a series circuit comprising two P-channel MOS transistors connected in series between one of said plurality of current mirror output terminals of said N-channel current mirror circuit and said power supply terminal, each P-channel MOS transistor having a gate and a drain connected in common; and a series circuit comprising two N-channel MOS transistors connected in series between one of said plurality of current mirror output terminals of said P-channel current mirror circuit and said ground terminal, each N-channel MOS transistor having a gate and a drain connected in common, wherein said P-channel MOS transistor of said second pair is connected between one of said plurality of current mirror output terminals of said N-channel current mirror circuit and said power supply terminal and has a gate and a drain connected in common, wherein said N-channel MOS transistor of said second pair is connected between one of said plurality of current mirror output terminals of said P-channel current mirror circuit and said ground terminal and has a gate and a drain connected in common, wherein a third bias signal and a fourth bias signal are respectively output as a part of said second bias signal set from third and fourth nodes as said gates of said P-channel and N-channel MOS transistors of said second pair, and a fifth bias signal is output as a part of said second bias signal set from a fifth node as said gate of one of said two P-channel MOS transistors of said series circuit on a side of said N-channel current mirror circuit and a sixth bias signal is output as a part of said second bias signal set from a sixth node as said gate of one of said two N-channel MOS transistors of said series circuit on a side of said P-channel current mirror circuit.

13. The drive circuit according to claim 12, wherein said common bias circuit further comprises:

a sixth switch connected between said third node and said gate of said P-channel MOS transistor of said second pair;

a seventh switch connected between said fourth node and said gate of said N-channel MOS transistor of said second pair;

an eighth switch connected between said third node and said ground terminal;

a ninth switch connected between said fourth and said power supply terminal;

a tenth switch connected between said fifth node and said power supply terminal; and an eleventh switch connected between said sixth node and said ground terminal.

14. The drive circuit according to claim 13, wherein said sixth and seventh switches are opened in a test mode and said eighths, ninth, tenth and eleventh switches are closed in said test mode.

15. A drive circuit comprising:

a plurality of differential AB class amplifier circuits connected in parallel, wherein each of the plurality of differential AB class amplifier circuits is configured as a voltage follower capable of inputting one of a plurality of analog signals and driving one of a plurality of data lines based on said one of a plurality of analog signals; and a common bias circuit which generates a first bias signal set comprising first and second bias signals and a second bias signal set comprising third, fourth, fifth and sixth bias signals, wherein said common bias circuit sets said first, second, third, fourth, fifth and sixth bias signals to one of a ground voltage level and a power supply voltage level in a test mode;

wherein each of said plurality of differential AB class amplifier circuits comprises:

an N-channel differential amplifier circuit connected between a power supply terminal and a ground terminal, said N-channel differential amplifier circuit being capable of inputting a differential signal and outputting a first output signal onto a first output line based on said first bias signal set, wherein said N-channel differential amplifier circuit contains an N-channel current source MOS transistor controlled based on said first bias signal of said first bias signal set;

a P-channel differential amplifier circuit connected between said power supply terminal and said ground terminal in parallel to said N-channel differential amplifier circuit to operate independently from said N-channel differential amplifier circuit, said P-channel differential amplifier circuit being capable of inputting said differential signal and outputting a second output signal onto a second output line based on said first bias signal set, wherein said P-channel differential amplifier circuit contains a P-channel current source MOS transistor controlled based on said second bias signal of said first bias signal set; and an output stage circuit capable of generating a drive signal from said first and second output signals based on said second bias signal set and outputting said drive signal onto an output terminal, wherein said output stage circuit comprises:

a pair of P-channel and N-channel output stage MOS transistors, wherein said P-channel output stage MOS transistor is connected between said power supply terminal and said output terminal and has a gate supplied with said first output signal, and said N-channel output stage MOS transistor is connected between said ground terminal and said output terminal and has a gate supplied with said second output signal;

a pair of P-channel and N-channel constant current MOS transistors, wherein said P-channel constant current MOS transistor is connected between said power supply terminal and said first output line and has a gate supplied with said third bias signal of said second bias signal set, and said N-channel constant current MOS transistor is connected between said ground terminal and said second output line and has a gate supplied with said fourth bias signal of said second bias signal set; and P-channel and N-channel shift MOS transistors connected in parallel between said first and second output lines to function as a level shifter, wherein said P-channel shift MOS transistor has a gate supplied with said fifth bias signal of said second bias signal set, and said N-channel shift MOS transistor has a gate supplied with said sixth bias signal of said second bias signal set.

16. A drive circuit comprising:

a plurality of differential AB class amplifier circuits connected in parallel, wherein each of the plurality of differential AB class amplifier circuits is configured as a voltage follower capable of inputting one of a plurality of analog signals and driving one of a plurality of data lines based on said one of a plurality of analog signals; and a common bias circuit which generates a first bias signal set comprising first and second bias signals and a second bias signal set comprising third, fourth, fifth and sixth bias signals, wherein said common bias circuit comprises:

a constant current source provided between a power supply terminal and a ground terminal;

a pair of P-channel and N-channel current mirror circuits, each current mirror circuit capable of outputting a plurality of mirror current signals from a plurality of current mirror output terminals based on a circuit current of said constant current source; and a first pair of P-channel and N-channel MOS transistors, wherein said P-channel MOS transistor of said first pair is connected between one of said plurality of current mirror output terminals of said N-channel current mirror circuit and said power supply terminal and has a gate and a drain connected in common, and said N-channel MOS transistor of said first pair is connected between one of said plurality of current mirror output terminals of said P-channel current mirror circuit and said ground terminal and has a gate and a drain connected in common, wherein said first and second bias signals of said first bias signal set are respectively outputted from said gates of said P-channel and N-channel MOS transistors of said first pair as first and second nodes, said common bias circuit further comprising:

a first switch connected in series with said constant current source;

a second switch connected in parallel to said P-channel current mirror circuit between said power supply terminal and said constant current source;

a third switch connected in parallel to said N-channel current mirror circuit between said ground terminal and a node between said P-channel and N-channel current mirror circuits;

a fourth switch connected between said gate of said P-channel MOS transistor of said pair and said power supply terminal; and a fifth switch connected between said gate of said N-channel MOS transistor of said pair and said ground terminal, wherein said first switch is opened in a test mode, and said second, third, fourth and fifth switches are closed in said test mode;

wherein each of said plurality of differential AB class amplifier circuits comprises:

an N-channel differential amplifier circuit connected between a power supply terminal and a ground terminal, said N-channel differential amplifier circuit being capable of inputting a differential signal and outputting a first output signal onto a first output line based on said first bias signal set, wherein said N-channel differential amplifier circuit contains an N-channel current source MOS transistor controlled based on said first bias signal of said first bias signal set;

a P-channel differential amplifier circuit connected between said power supply terminal and said ground terminal in parallel to said N-channel differential amplifier circuit to operate independently from said N-channel differential amplifier circuit, said P-channel differential amplifier circuit being capable of inputting said differential signal and outputting a second output signal onto a second output line based on said first bias signal set, wherein said P-channel differential amplifier circuit contains a P-channel current source MOS transistor controlled based on said second bias signal of said first bias signal set; and an output stage circuit capable of generating a drive signal from said first and second output signals based on said second bias signal set and outputting said drive signal onto an output terminal, wherein said output stage circuit comprises:

a pair of P-channel and N-channel output stage MOS transistors, wherein said P-channel output stage MOS transistor is connected between said power supply terminal and said output terminal and has a gate supplied with said first output signal, and said N-channel output stage MOS transistor is connected between said ground terminal and said output terminal and has a gate supplied with said second output signal;

a pair of P-channel and N-channel constant current MOS transistors, wherein said P-channel constant current MOS transistor is connected between said power supply terminal and said first output line and has a gate supplied with said third bias signal of said second bias signal set, and said N-channel constant current MOS transistor is connected between said ground terminal and said second output line and has a gate supplied with said fourth bias signal of said second bias signal set; and P-channel and N-channel shift MOS transistors connected in parallel between said first and second output lines to function as a level shifter, wherein said P-channel shift MOS transistor has a gate supplied with said fifth bias signal of said second bias signal set, and said N-channel shift MOS transistor has a gate supplied with said sixth bias signal of said second bias signal set.

17. A drive circuit comprising:

a plurality of differential AB class amplifier circuits connected in parallel, wherein each of the plurality of differential AB class amplifier circuits is configured as a voltage follower capable of inputting one of a plurality of analog signals and driving one of a plurality of data lines based on said one of a plurality of analog signals; and a common bias circuit which generates a first bias signal set comprising first and second bias signals and a second bias signal set comprising third, fourth, fifth and sixth bias signals, wherein said common bias circuit comprises:

a constant current source provided between said power supply terminal and said ground terminal; and a pair of P-channel and N-channel current mirror circuits, each current mirror circuits capable of outputting a plurality of mirror current signals from a plurality of current mirror output terminals based on a circuit current of said constant current source, wherein said first and second bias signals of said first bias signal set are respectively output from a first node between said constant current source and said P-channel current mirror circuit, and a second node between said P-channel and N-channel current mirror circuits, wherein said common bias circuit further comprises:

a first switch connected in series with said constant current source;

a second switch connected in parallel to said P-channel current mirror circuit between said power supply terminal and said constant current source; and a third switch connected in parallel to said N-channel current mirror circuit between said ground terminal and a node between said P-channel and N-channel current mirror circuits, wherein said first switch is opened in a test mode, and said second and third switches are closed in said test mode;

wherein each of said plurality of differential AB class amplifier circuits comprises:

an N-channel differential amplifier circuit connected between a power supply terminal and a ground terminal, said N-channel differential amplifier circuit being capable of inputting a differential signal and outputting a first output signal onto a first output line based on said first bias signal set, wherein said N-channel differential amplifier circuit contains an N-channel current source MOS transistor controlled based on said first bias signal of said first bias signal set;

a P-channel differential amplifier circuit connected between said power supply terminal and said ground terminal in parallel to said N-channel differential amplifier circuit to operate independently from said N-channel differential amplifier circuit, said P-channel differential amplifier circuit being capable of inputting said differential signal and outputting a second output signal onto a second output line based on said first bias signal set, wherein said P-channel differential amplifier circuit contains a P-channel current source MOS transistor controlled based on said second bias signal of said first bias signal set; and an output stage circuit capable of generating a drive signal from said first and second output signals based on said second bias signal set and outputting said drive signal onto an output terminal, wherein said output stage circuit comprises:

a pair of P-channel and N-channel output stage MOS transistors, wherein said P-channel output stage MOS transistor is connected between said power supply terminal and said output terminal and has a gate supplied with said first output signal, and said N-channel output stage MOS transistor is connected between said ground terminal and said output terminal and has a gate supplied with said second output signal;

a pair of P-channel and N-channel constant current MOS transistors, wherein said P-channel constant current MOS transistor is connected between said power supply terminal and said first output line and has a gate supplied with said third bias signal of said second bias signal set, and said N-channel constant current MOS transistor is connected between said ground terminal and said second output line and has a gate supplied with said fourth bias signal of said second bias signal set; and P-channel and N-channel shift MOS transistors connected in parallel between said first and second output lines to function as a level shifter, wherein said P-channel shift MOS transistor has a gate supplied with said fifth bias signal of said second bias signal set, and said N-channel shift MOS transistor has a gate supplied with said sixth bias signal of said second bias signal set.

18. The drive circuit according to claim 16, wherein said common bias circuit further comprises:

a second pair of P-channel and N-channel MOS transistors;

a series circuit of two P-channel MOS transistors which are connected in series between one of said plurality of current mirror output terminals of said N-channel current mirror circuit and said power supply terminal, and each of which has a gate and a drain which are connected in common; and a series circuit of two N-channel MOS transistors which are connected in series between one of said plurality of current mirror output terminals of said P-channel current mirror circuit and said ground terminal, and each of which has a gate and a drain which are connected in common, wherein said P-channel MOS transistor of said second pair is connected between one of said plurality of current mirror output terminals of said N-channel current mirror circuit and said power supply terminal and has a gate and a drain which are connected in common, wherein said N-channel MOS transistor of said second pair is connected between one of said plurality of current mirror output terminals of said P-channel current mirror circuit and said ground terminal and has a gate and a drain which are connected in common, wherein said third and fourth bias signals of said second bias signal set are respectively outputted from third and fourth nodes as said gates of said P-channel and N-channel MOS transistors of said second pair, and said fifth bias signal is outputted from a fifth node as said gate of one of said two P-channel MOS transistors of said series circuit on a side of said N-channel current mirror circuit and said sixth bias signal is outputted from a sixth node as said gate of one of said two N-channel MOS transistors of said series circuit on a side of said P-channel current mirror circuit, wherein said common bias circuit further comprises:

a sixth switch connected between said third node and said gate of said P-channel MOS transistor of said second pair;

a seventh switch connected between said fourth node and said gate of said N-channel MOS transistor of said second pair;

an eighth switch connected between said third node and said ground terminal;

a ninth switch connected between said fourth and said power supply terminal;

a tenth switch connected between said fifth node and said power supply terminal; and an eleventh switch connected between said sixth node and said ground terminal, and said sixth and seventh switches are opened in a test mode and said eighth to eleventh switches are closed in said test mode.

19. The drive circuit according to claim 17, wherein said common bias circuit further comprises:

a second pair of P-channel and N-channel MOS transistors;

a series circuit of two P-channel MOS transistors connected in series between one of said plurality of current mirror output terminals of said N-channel current mirror circuit and said power supply terminal, and each of which has a gate and a drain which are connected in common; and a series circuit of two N-channel MOS transistors connected in series between one of said plurality of current mirror output terminals of said P-channel current mirror circuit and said ground terminal, and each of which has a gate and a drain which are connected in common, wherein said P-channel MOS transistor of said second pair is connected between one of said plurality of current mirror output terminals of said N-channel current mirror circuit and said power supply terminal and has a gate and a drain connected in common, wherein said N-channel MOS transistor of said second pair is connected between one of said plurality of current mirror output terminals of said P-channel current mirror circuit and said ground terminal and has a gate and a drain connected in common, wherein said third and fourth bias signals of said second bias signal set are respectively output from third and fourth nodes as said gates of said P-channel and N-channel MOS transistors of said second pair, and said fifth bias signal is output from a fifth node as said gate of one of said two P-channel MOS transistors of said series circuit on a side of said N-channel current mirror circuit and said sixth bias signal is output from a sixth node as said gate of one of said two N-channel MOS transistors of said series circuit on a side of said P-channel current mirror circuit, wherein said common bias circuit further comprises:

a sixth switch connected between said third node and said gate of said P-channel MOS transistor of said second pair;

a seventh switch connected between said fourth node and said gate of said N-channel MOS transistor of said second pair;

an eighth switch connected between said third node and said ground terminal;

a ninth switch connected between said fourth and said power supply terminal;

a tenth switch connected between said fifth node and said power supply terminal; and an eleventh switch connected between said sixth node and said ground terminal, and said sixth and seventh switches are opened in a test mode and said eighth, ninth, tenth and eleventh switches are closed in said test mode.

* * * * *